(12) United States Patent
Kaylie et al.

(10) Patent No.: US 9,167,690 B1
(45) Date of Patent: *Oct. 20, 2015

(54) CARRIER FOR LTCC COMPONENTS

(71) Applicant: SCIENTIFIC COMPONENTS CORPORATION, Brooklyn, NY (US)

(72) Inventors: Harvey L. Kaylie, Brooklyn, NY (US); Aron Raklyar, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/299,701

(22) Filed: Jun. 9, 2014

Related U.S. Application Data

(62) Division of application No. 12/655,318, filed on Dec. 28, 2009, now Pat. No. 8,749,989.

(51) Int. Cl.
| | |
|---|---|
| H05K 7/10 | (2006.01) |
| H05K 7/12 | (2006.01) |
| H05K 1/11 | (2006.01) |
| H05K 1/09 | (2006.01) |

(52) U.S. Cl.
CPC .............. *H05K 1/111* (2013.01); *H05K 1/09* (2013.01); *H05K 1/113* (2013.01); *H05K 2201/032* (2013.01); *H05K 2201/0753* (2013.01)

(58) Field of Classification Search
USPC ................ 361/760–766, 767, 772–774; 257/684–688, 787–790
See application file for complete search history.

(56) References Cited

U.S. PATENT DOCUMENTS

| | | | | |
|---|---|---|---|---|
| 5,729,437 A | * | 3/1998 | Hashimoto | ............ 361/760 |
| 6,949,990 B2 | * | 9/2005 | Nishihara et al. | ............ 333/189 |

* cited by examiner

*Primary Examiner* — Tuan T Dinh
(74) *Attorney, Agent, or Firm* — Lawrence G. Fridman

(57) ABSTRACT

An LTCC carrier composed of thermosetting polymer, woven glass fiber and ceramic has gold over nickel contact pads on top and bottom surfaces and conductive vias therethrough between aligned pairs of top and bottom pads. The vias prevent undesirable inductive paths from limiting high frequency operation of the circuitry. Solder deposits on the top pads attach the LTCC component, which is further secured to the carrier by epoxy, thus improving resistance to thermal stress and mechanical shock. A slot through the carrier body between top and bottom surfaces further reduces thermal stress and mechanical shock. Metallized castellations on opposite carrier sides provide additional surface area for reflow solder joints with the PCB, and a means for visually inspecting the solder joint quality. A gap in the metallization on the top layer of the carrier prevents solder spreading during multiple soldering cycles, which may result in poor solder joints.

3 Claims, 3 Drawing Sheets

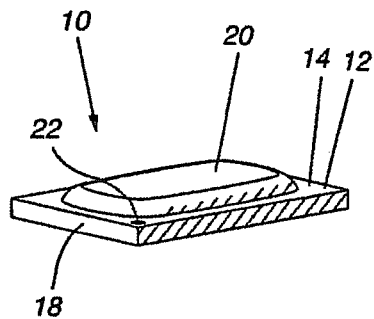
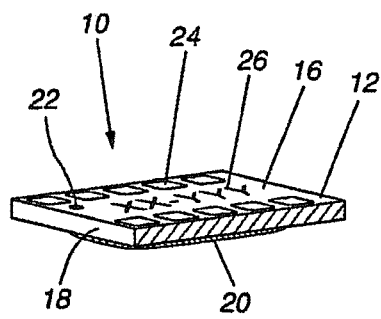
Fig. 1    Fig. 2
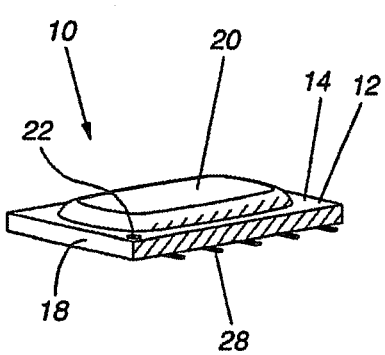
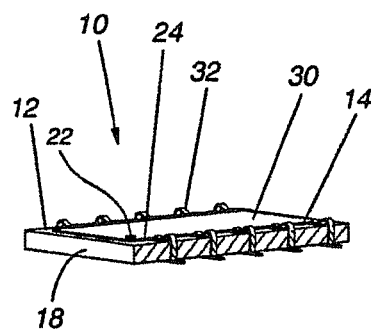
Fig. 3
Prior Art
Fig. 4
Prior Art

CARRIER FOR LTCC COMPONENTS

This is a divisional application of currently pending U.S. patent application Ser. No. 12/655,318 filed Dec. 28, 2009.

BACKGROUND OF THE INVENTION

1. Field of the Invention

This invention relates to carriers for electronic components and in particular to carriers for low temperature co-fired ceramic (LTCC) components.

2. Description of the Prior Art

Surface Mount Technology (SMT) is used by the electronics industry as a mass production technique for attaching electronic components to printed circuit boards (PCBs) by reflow soldering. The electronics industry has a continuing need to shrink components in order to decrease the PCB area needed for circuitry, and to fit more circuitry into a given area. One method of shrinking components is to use Low Temperature Co-fired Ceramic, (LTCC) which allows circuitry to be distributed in multiple stacked layers rather than being spread out in a single layer. Examples of LTCC circuitry, are disclosed in U.S. Pat. Nos. 7,049,905, 7,030,713 and 6,784,521. Semiconductor dice can also be attached to to LTCC components in order to further reduce PCB real estate requirements. Typically the semiconductor die is attached to the top layer of the LTCC component and examples of this are disclosed in U.S. Pat. Nos. 7,027,795 and 6,917,796.

Typically, LTCC components use Palladium Silver (PdAg) or gold over nickel for interconnect terminations, and while PdAg has lower cost and greater availability, gold over nickel is superior for less leaching out of metallization during soldering. Historically, gold over nickel has not been available as a finish for most LTCC designs. There exist a significant number of LTCC designs with PdAg finish and one aspect of this invention addresses such designs in terms of providing a finish of gold over nickel instead.

One quality problem in reflow soldering of LTCC components to PCBs is the inspection of solder joints. The typical interconnect termination for an LTCC component is located on the bottom of the component and thus visual inspection of the solder joints is difficult when the component has been soldered in place on a PCB. One technique to allow easier visual inspection of the solder joints involves welding or brazing metal leads to the terminations, though this adds expense and the risk of damage to the terminations. Another technique is to add solderable wraparound metal leads to the LTCC package, which results in reduced real estate for circuitry on the top layer and adds lead inductance, thus reducing high frequency performance.

Another quality problem for LTCC components is in mitigating thermal stress and mechanical shock, which can cause interconnect termination joint failure or even cracking of the component. The coefficient of thermal expansion (CTE) of ceramic and silicon components is sufficiently different from the CTE of typical epoxy fiberglass PCBs that this mismatch can cause solder joint failure with changes in temperature. The CTE mismatch problem is worse for larger components where the amount of thermally induced mechanical stress is greater. Techniques used to provide thermal stress relief for LTCC and semiconductor components generally take the form of an intermediate substrate or interposer, either attached first to the component and thus serving as a carrier, or attached to the PCB, often in the form of a specialized layer. These intermediate structures generally either function by providing a mechanically flexible means to absorb movement and stress generated by CTE mismatch, or by providing an intermediate CTE so that the solder joints on each side of the intermediate structure each see less thermal stress.

U.S. Pat. No. 7,554,206 discloses a flexible substrate with arrays of conductive pads and conductive posts on opposite sides of the substrate and offset from each other to permit movement in response to thermal expansion. This substrate requires numerous manufacturing steps and is a mechanically complex solution to the problem, and since the conductive posts are under the component, provides no improvement to inspection of the resulting solder joints.

U.S. Pat. No. 6,717,819 discloses a flexible substrate having via holes filled with conductive adhesive, where the surfaces of the substrate over the via holes are coated with solderable metal contacts. Since the solderable contacts are under the component it provides no improvement to inspection of the resulting solder joints.

U.S. Pat. No. 6,163,462 discloses a flexible substrate having ball grid arrays on both faces, where the ball grid arrays are connected by conductive vias through the substrate and are either offset or aligned. When offset, the substrate between each pair of solder balls is able to flex and warp in response to thermal stress. When aligned, the substrate has holes interposed between the solder balls to permit more flexure of the substrate. However, in either version the solder joints are under the substrate and thus difficult to inspect.

In U.S. Pat. No. 5,369,551 an interface board is configured to be placed between a leadless component and a PCB. The interface board is made of material having a thermal coefficient similar to that of the PCB. Solder pads on opposite sides of the interface board are offset from each other and PCB material is selectively removed to allow the board to flex. This approach causes the footprint of the PCB to be different than that of the component, which is a major drawback.

In U.S. Pat. No. 5,573,172 a hidden lead package device is placed between a leadless component and a PCB. One end of the hidden lead is brazed to the leadless component and the other end Is soldered to the PCB. This approach causes the footprint of the PCB to be different than that of the component, which is not acceptable in existing PCB designs and in addition, the brazing operation could result in cracking of the LTCC material.

U.S. Pat. No. 4,855,872 discloses a surface mount component attached to an interposer formed from a thin, flexible polymer sheet with conductive traces radiating outward from the component to the sheet edges where the traces can then be soldered to a PCB. The sheet interposer is able to flex in response to thermal stress and the solder joints can be inspected, but requires additional PCB real estate to function and requires the users to design a specialized PCB.

A variant on the flexible substrate approach to mitigating CTE mismatch between surface mount components and PCBs is disclosed in U.S. Pat. No. 4,558,397 wherein a hollow dielectric frame serves as a carrier for the component, using metal clips spanning from the frame's bottom surface to the frame's top surface as conductive elements which the component is soldered to and then in turn the assembly is soldered to the PCB. The disadvantage of this approach is that the metal clips will increase circuit inductance and thus limit high frequency operation, and also have to be manufactured as separate parts and then assembled onto the dielectric frame.

U.S. Pat. No. 4,847,136 discloses a PCB with a relatively thin expansion layer bonded to the surface of the PCB as a means to mitigate CTE mismatch between the PCB and a surface mount component. This approach has the disadvantage of requiring specialized manufacturing for the PCB, requires additional real estate, and also does not address the problem of solder joint inspection since the solder joints are either under the component or are situated at leads extending outwards which lower the usable frequency range of the circuit.

Another approach to mitigating the CTE difference between LTCC components or other ceramic or silicon based components and a PCB substrate is the use of interposers or intermediate mounting substrates with a CTE intermediate that of the component and the PCB. Examples of these intermediate CTE interposers are disclosed in U.S. Pat. Nos. 6,734,540, 6,516,513 and Patent Application 2009/0002963. All three of these inventions provide solder connections under the interposers or substrates and thus provide no improvement in ability to inspect the solder joints.

One form of a carrier for surface mount components is disclosed in U.S. Pat. No. 6,862,190, wherein the carrier adapts the termination footprint of a surface mount device to a different and generally larger footprint on a PCB. This carrier has a generally simple and useful form but has leads long enough to impose limits on high frequency operation and by being substantially larger than the surface mount component is inefficient for mounting the component with a minimal increase in PCB real estate.

There is a need for a cost-effective means to reliably attach an LTCC or other surface mount component to a PCB or similar electronic substrate without leaching of metallization during reflow soldering, with improved capability for visual inspection of the solder joints, with a reduction in thermal stress and mechanical shock on the solder joints, with no significant increase in required PCB real estate required for mounting, and permitting circuit operation at up to and including microwave frequencies.

SUMMARY

The improved carrier for an LTCC component described herein provides attachment of an LTCC component to a PCB with increased resistance to thermal stress and mechanical shock, reduced leaching of metal from contact pads, and a visible solder joint to aid in quality inspection after reflow soldering. The carrier provides these benefits cost-effectively and with minimal increase in required PCB real estate.

The carrier has a flat body composed of a mixture of thermosetting polymer, woven glass fiber and ceramic, or pure ceramic. The top and bottom surfaces of the carrier have metal contact pads aligned over each other, spaced to correspond to the interconnect pads of the LTCC component which will be bonded to the carrier. Each pair of top and bottom contact pads is electrically connected by at least one conductive via passing through the body of the carrier, except in the ceramic carriers. The material of the contact pads is gold over nickel rather than the standard PdAg alloy metal, thus preventing metal leaching during reflow soldering and providing a stronger solder bond. Solder is deposited on the top pads to prepare them for attachment to the LTCC component, which is further secured to the carrier by a layer of adhesive on the carrier top surface. This adhesive is preferably an epoxy and serves to further improve bonding between the LTCC component and the carrier, making the assembly more resistant to thermal stress and mechanical shock. Since the material of the LTCC component and the material of the non-ceramic carriers have very different CTE, a slot is made through the non-ceramic carrier between the top and bottom surfaces to allow better accommodation of differences in thermal expansion. Castellations are present on at least some pairs of opposite sides of the carrier, with metallization in the castellations providing additional surface area for the reflow solder joint with the PCB, and a means for visually inspecting the quality of the solder joint. To prevent solder spreading from the metallization, a gap is present in the metallization preferably near the top contact pads thus preventing poor solder joint quality between the carrier and the LTCC component.

OBJECTS AND FEATURES OF THE INVENTION

It is an object of the invention to provide a carrier for an electronic component having improved contact metallization for less contact metal leaching during reflow soldering.

It is another object of the invention to provide a carrier for an electronic component where the carrier doesn't impair high frequency performance.

It is yet another object of the invention to provide a carrier for an electronic component having improved resistance to failure from thermal stress and mechanical shock.

It is a feature of the invention to provide a carrier for an electronic component that permits easier visual inspection of solder joints after soldering to a PCB.

It is another feature of the invention to provide a carrier for an electronic component that doesn't limit the top surface real estate available for circuit features and bonding of semiconductor dice.

It is yet another feature of the invention to have gold over nickel metallization.

It is still another feature of the invention to have a body at least partially composed of ceramic, glass fibers or thermoset polymer.

It is a further feature of the invention to have conductive thru vias.

It is an additional feature of the invention to have metallized side castellations.

It is yet a further feature of the invention to have a center thru-slot.

It is still a further feature of the invention to have top and bottom contact pads.

It is yet an additional feature of the invention to have solder deposited on the top contact pads.

It is another additional feature of the invention to have wrap-around metal pads used with ceramic carriers.

BRIEF DESCRIPTION OF THE DRAWINGS

FIG. 1 is an isometric view of an LTCC component with a semiconductor die encapsulated on the top layer.

FIG. 2 is an isometric view of the bottom of an LTCC component.

FIG. 3 is an isometric view of an LTCC component with leads attached to the interconnect terminations.

FIG. 4 is an isometric view of an LTCC component with metal clips attached to the interconnect terminations as leads.

DESCRIPTION OF THE PREFERRED EMBODIMENT AND BEST MODE

Figure 5A:
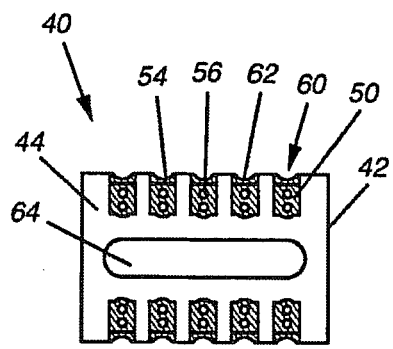
FIG. 5a is a plan view of an LTCC carrier.

Referring to FIGS. 1 and 2, an LTCC component 10 is shown with a plastic-encapsulated semiconductor die 20 mounted on the LTCC top surface 14. Mounting orientation of the component 10 is shown by the orientation mark 22 placed on both the LTCC top surface 14 and the LTCC bottom surface 16. The LTCC bottom surface 16 also features an identification mark 26, and conductive termination pads 24 with which the component 10 is soldered to a substrate, typically a PCB. The component body 12 is composed of low temperature co-fired ceramic (LTCC) and has a different coefficient of thermal expansion (CTE) than the fiberglass and epoxy PCB that it is soldered to. Additionally, the standard material that the conductive termination pads 24 are made of is a palladium silver alloy (PdAg) which has been found to leach out during successive heating cycles such as those experienced during reflow soldering. Both the CTE mismatch and the leaching of metal from the conductive termination pads 24 can contribute to solder joint failure during or after reflow soldering, whether from thermal stress or mechanical shock or both in combination. Additionally, the positioning of the conductive termination pads 24 and thus the solder joints on the LTCC bottom surface 16 of the component 10 make it difficult to inspect the solder joints.

FIG. 3 shows one prior art solution to the inspection problem, wherein leads 28 have been attached to the conductive termination pads 24 by welding or brazing, and protrude below the sides 18. While these leads 28 produce more visible solder joints, they do so at the expense of additional PCB real estate. Additionally, the process of welding or brazing the leads 28 can damage the conductive termination pads 24.

FIG. 4 shows another prior art solution to the inspection problem, where the LTCC component as shown has insulation material 30 covering the top surface 14 and wherein the conductive termination pads 24 are located on the LTCC top surface 14 and metal clips 32 are used to bring the terminations around the LTCC sides 18 to the LTCC bottom surface 16 for attachment to a PCB. This approach of soldering metal clips 32 sacrifices a portion of the real estate of the LTCC top surface 14 and thus either smaller or fewer semiconductors or other circuit components can be mounted on the LTCC top surface 14, or a larger and more expensive LTCC component body 12 is required. Additionally, the metal pathways between the LTCC top surface 14 conductive termination pads 24 and the PCB connections increase the inductance of the interconnection, making the technique unsuitable for use with circuitry operating in the upper microwave frequency range.

Figure 5B:
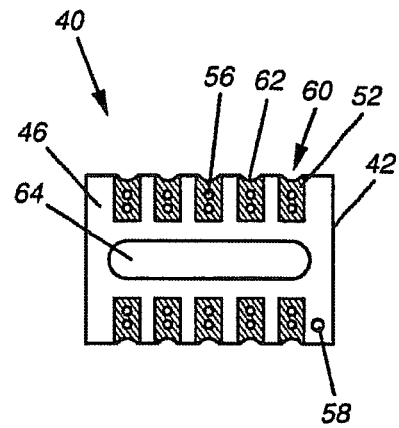
FIG. 5b is a bottom view of an LTCC carrier.
Figure 5C:
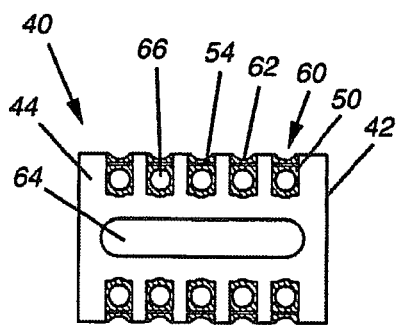
FIG. 5c is a plan view of an LTCC carrier with solder paste on metal pads.
Figure 6:
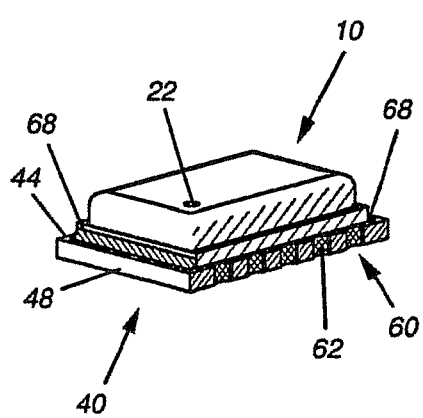
FIG. 6 is an isometric view of an LTCC carrier with a semiconductor topped LTCC component attached with epoxy.

A carrier for LTCC components that is designed to solve the problems of solder joint failure and solder joint inspection is shown in FIGS. 5A, 5B. The LTCC carrier 40 is similar in size to the LTCC component 10 and features a carrier body 42 composed of insulating materials such as thermoset polymer, glass fiber, ceramic, and woven glass fiber reinforced, ceramic filled thermoset polymer. An index mark 58 is shown on the carrier bottom surface 46. The LTCC carrier 40 has a CTE different than the ceramic body of the LTCC component and more similar in the critical X,Y direction to that of the PCB. For example, typical CTE of the thermosetting polymer, woven glass fiber and ceramic composite material is 14-16 ppm/° C. in the X,Y direction, and 35 ppm/° C. in the Z direction. By contrast, typical CTE for FR4 fiberglass is 13-14 ppm/° C. and 50-250 ppm/° C. respectively, for ceramic 6.8-7.2 ppm/° C. in all directions, and for LTCC 4.7 ppm/° C. in all directions. The carrier 40 has top contact metal pads 50 and bottom contact metal pads 52 aligned over each other which are electrically connected by a series of plated via holes 56 and which are composed of gold over nickel, a metal combination having improved resistance to metal leaching during reflow versus PdAg alloys. Typically for gold over nickel, copper is first deposited as an interfacing layer below the nickel, then the nickel is deposited to a thickness in the range of 2-6 microns and finally the gold is deposited to a thickness typically in the range of 0.05-0.13 microns. The spacing and alignment of the contact pads corresponds to that of the conductive termination pads 24 of the LTCC component 10 that will be bonded to the carrier 40. Some of the sides 48 (as shown in FIG. 6) of the carrier body 42 have castellations 60 coated with metallization 62 which form solderable areas along the sides 48 of the carrier body 42. To prevent solder spreading during reflow, there is a gap 54 in the metallization 62 between the top contact metal pads 50 and bottom contact metal pads 52, here shown on the carrier top surface 44. In FIG. 5C the top contact metal pads 50 are shown coated with solder paste 66.

A slot or aperture 64 through the carrier body 42 between the carrier top surface 44 and the carrier bottom surface 46 allows a reduction in thermal stress between the LTCC component 10 and the carrier 40, thus reducing the possibility of solder joint failure from CTE mismatches.

FIG. 6 shows the LTCC carrier 40 with an LTCC component 10 which has been attached to the carrier top surface 44 by reflow soldering and by epoxy or adhesive for additional mechanical strength. Epoxy or adhesive fillets 68 are visible at the ends of the joint. The LTCC carrier 40 with LTCC component 10 attached can now be reflow soldered to the PCB with a visible and more robust solder joint as solder on the PCB bonds with the metallization 62 on the bottom contact metal pads and in the castellations 60.

In production, the LTCC carrier 40 is prepared for use by the deposit of solder paste 66 to the top contact metal pads 50 and epoxy 68 to portions of the carrier top surface 44. The LTCC component 10 is placed in alignment with the top surface 44 and the assembly is heated to melt the solder paste 66 and electrically join the LTCC component 10 and LTCC carrier 40 together. The PCB is prepared with solder paste and the assembled pair of LTCC component 10 and LTCC carrier 40 are placed in alignment. This assembly is then heated to melt the solder paste on the PCB, and the molten solder joins to the bottom contact metal pads 52 and wicks up the metallization 62 into the castellations 60, providing easily inspected solder joints.

Figure 7A:
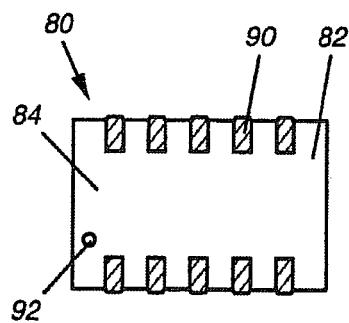
FIG. 7a is a plan view of a ceramic LTCC carrier.
Figure 7B:
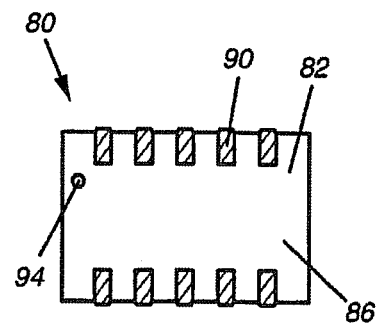
FIG. 7b is a bottom view of a ceramic LTCC carrier.
Figure 7C:
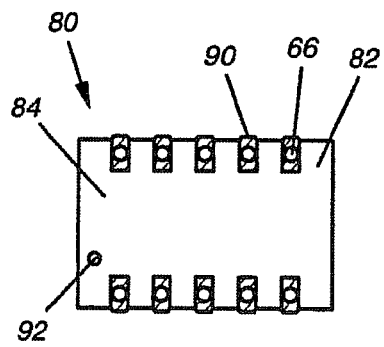
FIG. 7c is a plan view of a ceramic LTCC carrier with solder paste on metal pads.
Figure 8:
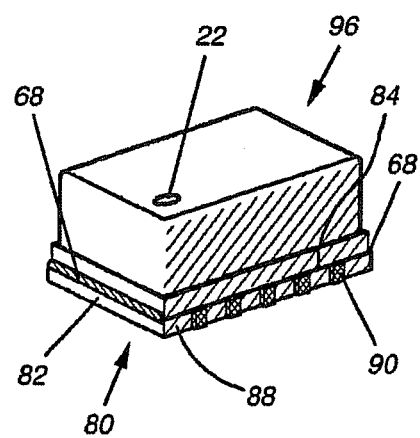
FIG. 8 is an isometric view of an LTCC with a ceramic carrier and cover, wherein the LTCC and carrier are secured with epoxy.

Another embodiment of the LTCC carrier is intended for extended temperature operation, as shown in FIGS. 7A, 7B. The ceramic carrier 80 has a ceramic body 82 which will withstand higher temperature range environments than would a body made of polymer materials. The ceramic carrier 80 has wrap around metal pads 90 which provide conductive pathways between the ceramic bottom surface 86 and ceramic top surface 84 along the ceramic sides 88, these pathways providing acceptable performance up to low microwave frequencies. For higher frequencies, conductive vias are required. The ceramic top surface 84 has a top index mark 92 and the ceramic bottom surface has a bottom index mark 94. In FIG. 7C the portion of the wrap around metal pads 90 on the ceramic top surface 84 are shown with solder paste 66 dispensed. FIG. 8 shows a ceramic covered LTCC component 96 which has been attached to the ceramic carrier top surface 84 by reflow soldering and by epoxy for additional mechanical strength. Epoxy fillets 68 are visible at the ends of the joint.

The temperature coefficients of the ceramic and the LTCC material are close enough that the metallization is robust and no slot is required.

In production, the LTCC ceramic carrier 80 is prepared for use by the deposit of solder paste 66 on the ceramic carrier top surface 84 portion of the wrap around metal pads 90 and epoxy 68 to portions of the ceramic carrier top surface 84. The ceramic covered LTCC component 96 is placed in alignment with the ceramic carrier top surface 84 and the assembly is heated to melt the solder paste 66 and electrically join the ceramic covered LTCC component 96 and ceramic carrier 80 together. The PCB is prepared with solder paste and the assembled pair of ceramic covered LTCC component 96 and LTCC ceramic carrier 80 are placed in alignment. This assembly is then heated to melt the solder paste on the PCB and solder the assembled pair of ceramic covered LTCC component 96 and LTCC ceramic carrier 80 to the PCB.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A carrier for electronic components comprising:
   an insulated body having a first face, a second face and a plurality of sides therebetween;
   the material composition of said insulating body being selected from the group consisting of woven glass fiber, ceramic, thermosetting polymer, and a body having a combination thereof;
   an aperture in said body extending between said first face and said second face;
   at least one top contact pad on said first face;
   at least one bottom contact pad on said second face;
   said top contact pad and said bottom contact pad being at least partially composed of gold over nickel;
   at least one conductive via through said insulating body between paired top contact pads and bottom contact pads;
   a solder layer disposed on said first face, covering at least a portion of said top contact pads area;
   a plurality of castellations on at least one of said sides;
   a conductive metallization, said metallization covering at least a portion of said castellations and extending past said castellations;
   said metallization forming a conductive pathway between said paired top contact pads and bottom contact pads;
   said metallization having a gap proximate each of said top contact pads;
   an adhesive covering a portion of said first surface; and
   said adhesive providing means for binding an electronic component to said first surface for improved resistance to thermal stress and mechanical shock.

2. The carrier for electronic components as described in claim 1, further comprising:
   a plurality of said top contact pads and of said bottom contact pads;
   said plurality of said top contact pads comprising two parallel rows of top contact pads;
   said plurality of said bottom contact pads comprising two parallel rows of bottom contact pads positioned directly opposite said top contact pads; and,
   wherein said aperture is oriented longitudinally between said parallel rows of top and bottom contact pads.

3. The carrier for electronic components as described in claim 1, wherein said adhesive is an epoxy.

* * * * *